(12) United States Patent
Sridhar et al.

(10) Patent No.: US 12,300,468 B2
(45) Date of Patent: May 13, 2025

(54) METHOD OF UNIFORMITY CONTROL

(71) Applicant: Tokyo Electron Limited, Tokyo (JP)

(72) Inventors: Shyam Sridhar, Austin, TX (US);
Ya-Ming Chen, Austin, TX (US); Peter Lowell George Ventzek, Austin, TX (US); Mitsunori Ohata, Taiwa-cho (JP); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 354 days.

(21) Appl. No.: 17/841,443

(22) Filed: Jun. 15, 2022

(65) Prior Publication Data
US 2023/0377849 A1 Nov. 23, 2023

Related U.S. Application Data

(60) Provisional application No. 63/344,594, filed on May 22, 2022.

(51) Int. Cl.
| | |
|---|---|
| *H01L 21/3065* | (2006.01) |
| *H01J 37/32* | (2006.01) |
| *H01L 21/311* | (2006.01) |

(52) U.S. Cl.
CPC .. *H01J 37/32449* (2013.01); *H01J 37/32146* (2013.01); *H01L 21/3065* (2013.01); *H01L 21/31116* (2013.01); *H01J 2237/332* (2013.01); *H01J 2237/3343* (2013.01)

(58) Field of Classification Search
None
See application file for complete search history.

(56) References Cited

U.S. PATENT DOCUMENTS

| | | | |
|---|---|---|---|
| 7,832,354 B2 | 11/2010 | Katz et al. | |
| 9,396,960 B2 * | 7/2016 | Ogawa | H01J 37/32568 |
| 2006/0060303 A1 | 3/2006 | Fink et al. | |
| 2007/0293043 A1 | 12/2007 | Singh et al. | |
| 2009/0057269 A1 | 3/2009 | Katz et al. | |

* cited by examiner

*Primary Examiner* — Roberts P Culbert
(74) *Attorney, Agent, or Firm* — Slater Matsil, LLP

(57) ABSTRACT

A method of processing a substrate that includes: loading the substrate in a plasma processing chamber, the substrate including an underlying layer; maintaining a steady state flow of a process gas into the plasma processing chamber in the plasma processing chamber; generating a plasma in the plasma processing chamber; exposing the substrate to the plasma to etch the underlying layer; and pulsing a first additional gas, using a first effusive gas injector, towards a first region of the substrate to disrupt the steady state flow of the process gas over the first region, the pulsing locally changing a composition of the plasma near the first region.

14 Claims, 7 Drawing Sheets

METHOD OF UNIFORMITY CONTROL

CROSS-REFERENCE TO RELATED APPLICATIONS

This application claims the benefit of U.S. Provisional Application No. 63/344,594, filed on May 22, 2022, which application is hereby incorporated herein by reference.

TECHNICAL FIELD

The present invention relates generally to a system and method of processing a substrate, and, in particular embodiments, to uniformity control.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes. Plasma processing techniques include chemical dry etching (CDE) (e.g., plasma ashing), physical or sputter etching, reactive ion etching (RIE), and plasma-enhanced chemical vapor deposition (PECVD).

Driven by an insatiable demand for low cost electronics with high functionality, the minimum feature sizes have been shrunk to reduce cost by roughly doubling the component packing density at each successive technology node. Innovations in patterning such as immersion photolithography, multiple patterning, and 13.5 nm wavelength extreme ultraviolet (EUV) optical systems have brought critical feature sizes down close to ten nanometers. Concurrently, unconventional materials such as organics, ferroelectrics, and chalcogenides are being increasingly used in products. This scenario poses a challenge for plasma technology to provide processes for patterning features with accuracy, precision, and profile control, often at atomic scale dimensions. Meeting this challenge along with the uniformity and repeatability needed for high volume IC manufacturing requires further innovations.

SUMMARY

In accordance with an embodiment of the present invention, a method of processing a substrate that includes: loading the substrate in a plasma processing chamber, the substrate including an underlying layer; maintaining a steady state flow of a process gas into the plasma processing chamber in the plasma processing chamber; generating a plasma in the plasma processing chamber; exposing the substrate to the plasma to etch the underlying layer; and pulsing a first additional gas, using a first effusive gas injector, towards a first region of the substrate to disrupt the steady state flow of the process gas over the first region, the pulsing locally changing a composition of the plasma near the first region.

In accordance with an embodiment of the present invention, a method of processing a substrate that includes: loading the substrate in a plasma processing chamber, the substrate including an underlying layer; maintaining a steady state flow of a process gas into the plasma processing chamber in the plasma processing chamber; providing a pulsed RF source power to a first electrode of the plasma processing chamber to generate a plasma in the plasma processing chamber; providing a pulsed RF bias power to a second electrode of the plasma processing chamber to bias the plasma; exposing the substrate to the plasma to etch the underlying layer; and pulsing an additional gas, using an effusive gas injector, towards a region of the substrate to disrupt the steady state flow of the process gas over the region, the pulsing locally changing a composition of the plasma near the first region.

In accordance with an embodiment of the present invention, a plasma etching system for a substrate including: a plasma processing chamber; a substrate holder disposed in the plasma processing chamber; a first RF power source configured to generate a plasma in the plasma processing chamber; a second RF power source configured to bias the plasma; a main gas inlet system configured to flow a process gas into the plasma processing chamber; effusive gas injectors configured to inject an additional gas into the plasma processing chamber; and a controller coupled to the first RF power source, the second RF power source, the main gas inlet system, and the effusive gas injectors.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A and 5B illustrate cross sectional views of an example substrate after a conventional plasma etch process with a non-uniformity issue, wherein FIG. 5A illustrates a profile with footing at the center of the substrate, and FIG. 5B illustrates a profile at the edge of the substrate;

FIGS. 6A and 6B illustrate cross sectional views of an example substrate during a plasma etch process in accordance with various embodiments, wherein FIG. 6A illustrates a profile at the center of the substrate with additional etchants, and FIG. 6B illustrates a profile at the edge of the substrate;

FIGS. 7A and 7B illustrate cross sectional views of an example substrate after the plasma etch process illustrated in FIGS. 6A and 6B in accordance with various embodiments, wherein FIG. 7A illustrates a profile at the center of the substrate, and FIG. 7B illustrates a profile at the edge of the substrate;

FIGS. 8A and 8B illustrate cross sectional views of an example substrate after a conventional plasma etch process with a non-uniformity issue, wherein FIG. 8A illustrates a profile at the center of the substrate, and FIG. 8B illustrates a profile with bowing at the edge of the substrate;

FIGS. 9A and 9B illustrate cross sectional views of an example substrate during a passivation phase of a plasma etch process in accordance with various embodiments, wherein FIG. 9A illustrates a profile at the center of the substrate, and FIG. 9B illustrates a profile at the edge of the substrate with additional passivants;

FIGS. 10A and 10B illustrate cross sectional views of an example substrate during an etch phase of a plasma etch process in accordance with various embodiments, wherein FIG. 10A illustrates a profile at the center of the substrate, and FIG. 10B illustrates a profile at the edge of the substrate with reinforced passivation;

FIGS. 11A and 11B illustrate cross sectional views of an example substrate after the plasma etch process illustrated in FIGS. 9A-9B and 10A-10B in accordance with various embodiments, wherein FIG. 11A illustrates a profile at the center of the substrate, and FIG. 11B illustrates a profile at the edge of the substrate;

DETAILED DESCRIPTION OF ILLUSTRATIVE EMBODIMENTS

Figure 1:
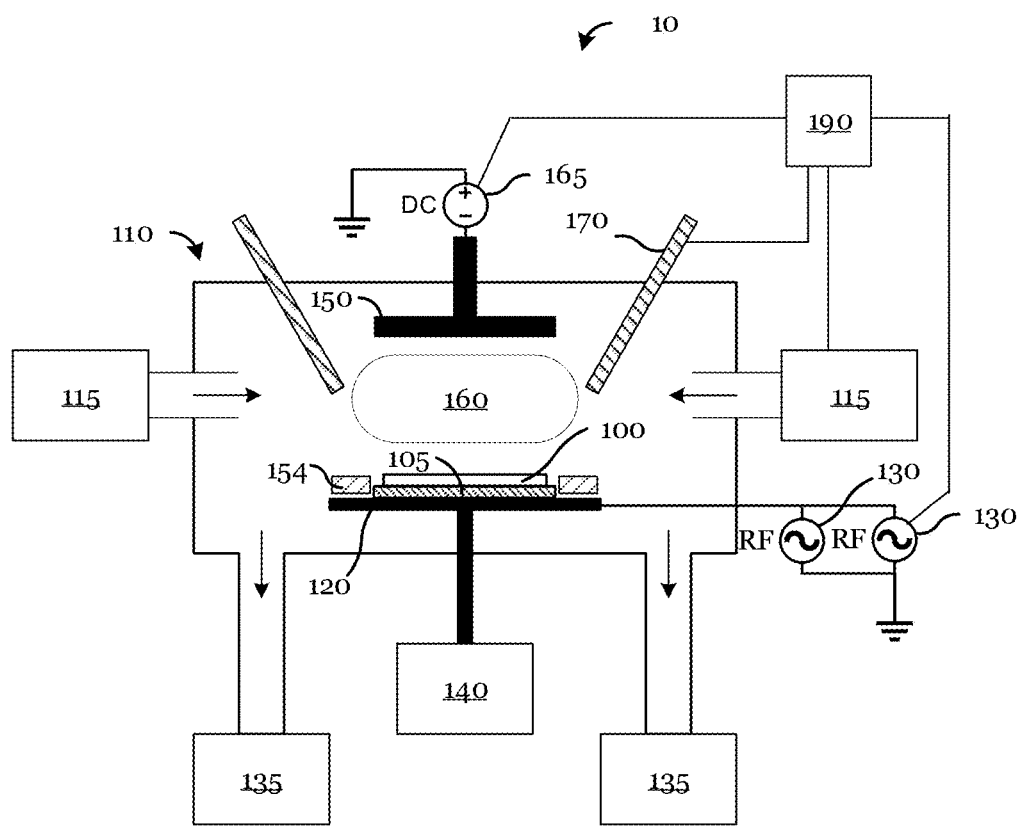
FIG. 1 illustrates an example plasma processing system having a set of effusive gas injectors in accordance with various embodiments.

This application relates to a method of processing a substrate, more particularly to uniformity control during a plasma etch process using additional gas injection. Plasma etching is a complex surface phenomena which occurs as a result of synergistic surface process involving etchant radicals, ions, and passivating species. The relative fluxes of these species and the kinetics of the surface reactions determines the etch properties such as etching rate, feature critical dimensions, and selectivity. Etch non-uniformity occurs as a result of an imbalance in the fluxes of the above-mentioned species from center to edge of the wafer. Such an imbalance can result in etching characteristics at the center to be different from that at the edge, resulting in center high or edge high signatures for etching rates and varying critical dimensions (CDs). Furthermore, etch performance at the wafer edge may be further exacerbated by the thermal, electrical, and/or chemical discontinuities. It is therefore critical to have minimum deviations/variations in the etching characteristics at the wafer edge due to wafer yield concerns. Hence, any method to improve edge performance is highly valuable.

Embodiments of the present application disclose methods of pulsing an additional gas into a plasma processing chamber to localize the flux of desirable species such as etchant (e.g., Cl, F, and Br) and/or passivants (e.g., $C_xH_yF_z$, $SiBr_x$, and $SiCl_x$) to improve the uniformity of the plasma for etching. For example, in etching of silicon, pulsed gas injection of a passivating gas, such as $SiCl_4/O_2$, can provide additional passivating species locally and compensate for high etching rates or profile differences that are commonly observed in a conventional etch process using continuous gas injection. The localization of the gas flux is achieved by the effusive gas flowing through a nozzle, the dimensions of the nozzle imparting a directional beam like flux distribution. The position of the gas inlet nozzle (center/side/ring) and the direction of gas injection can determine the directionality and localization of etching/passivating fluxes.

In the following, a set of effusive gas injectors and its controller implemented in an example plasma processing chamber in accordance with various embodiments are described referring to FIGS. 1 and 2. These effusive gas injectors enable additional gas injection to localize the fluxes. Subsequently, possible plasma uniformity control enabled by localizing the fluxes is described by illustrating the local etch rate adjustment referring to FIGS. 3 and 4. Two exemplary uniformity control methods are then described. First, an example of pulsing additional etchants at the center of a substrate is described referring to FIGS. 5A-5B, 6A-6B, and 7A-7B. Second, another example of pulsing additional passivants at the edge of a substrate is described referring to FIGS. 8A-8B, 9A-9B, 10A-10B, and 11A-11B. Corresponding to these two methods, two examples of additional gas pulse trains in relation to source power and bias power are described referring to FIGS. 12 and 13. An example process flow diagram is illustrated in FIG. 14. All figures in this disclosure are drawn for illustration purpose only and not to scale, including the aspect ratios of features.

FIG. 1 illustrates an example plasma processing system 10 having a set of effusive gas injectors 170 in accordance with various embodiments.

As illustrated in FIG. 1, the plasma processing system 10 comprises a plasma processing chamber 110, and a substrate 100 may be placed on a substrate holder 105. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

A process gas may be primarily introduced into the plasma processing chamber 110 by a main gas delivery system 115. The main gas delivery system 115 may be connected to an integrated control circuit 190 that controls the process gas flow rate. In various embodiments, the process gas flowed by the main gas delivery system 115 may establish a steady state flow. In some embodiments, optional center/edge splitters may be used to independently adjust the gas flow rates at the center and edge of the substrate 100. Further, in one embodiment, the main gas delivery system 115 may have a special showerhead configuration positioned at the top of the plasma processing chamber 110. For example, the main gas delivery system 115 may be integrated with a top electrode 150, having a showerhead configuration on the top electrode 150, covering the entirety of the substrate 100, including a plurality of appropriately spaced gas inlets. The plasma processing chamber 110 may further be equipped with one or more sensors such as pressure monitors, gas flow monitors, and/or gas species density monitors. The sensors may be integrated as a part of the main gas delivery system 115 in various embodiments.

In various embodiments, the plasma processing chamber 110 is particularly characterized by the set of effusive gas injectors 170 connected to the integrated control circuit 190.

The effusive gas injectors 170 may be configured to rapidly pulse one or more additional gas into the plasma processing chamber 110 and disrupt the steady state flow of the process gas established by the main gas delivery system 115. In FIG. 1, two effusive gas injectors 170 are illustrated, with each of them being disposed in the upper side of the plasma processing chamber 110 and pointing toward the edge of the substrate 100 so that the flux of the additional gas may be localized to the edge of the substrate 100. In other embodiments, however, any number of effusive gas injectors may be used and arranged differently, for example, pointing toward the center of the substrate 100 or being disposed on the sidewall of the plasma processing chamber 110.

The purpose of adding the set of effusive gas injectors 170 to the plasma processing system 10 is to improve the uniformity of plasma etching performance across the substrate 100 by enhancing localization of the gas fluxes. By pulsing the additional gas at a faster rate than the time it takes to attain a steady state flow, the flux of the desired gas can be localized around the point of first impact, i.e., where the gas beam first contacts with the substrate 100. With such highly localized flux control with a directed pulsed gas injection, it may be conceived to use multiple nozzles that can be directed at different locations on the substrate 100. Utilizing this capability of localizing the gas fluxes, the non-uniformity of the plasma that causes non-uniform etch profile (e.g., center-to-edge variations) may be compensated.

Still referring to FIG. 1, the plasma processing chamber 110 is a vacuum chamber and may be evacuated using one or more vacuum pumps 135, such as a single stage pumping system or a multistage pumping system (e.g., a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a temperature controller. In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the temperature controller. The bottom electrode 120 may be connected to one or more RF power sources 130 to generate a plasma 160 in the plasma processing chamber 110. A typical frequency for the RF bias can range from about 0.1 MHz to about 6 GHz, and can be 13.56 MHz. As illustrated in FIG. 1, more than one RF power sources may be used, for example, to provide a low frequency RF power and a high frequency RF power at the same time. The RF power sources 130 may be used to supply continuous wave (CW) or pulsed RF power to sustain the plasma 160. The plasma 160, shown between a top electrode 150 and the bottom electrode 120, exemplifies direct plasma generated close to the substrate 100 in the plasma processing chamber 110.

In various embodiments, a RF pulsing at a kHz range may be used to power the plasma 160. Using the RF pulsing may help generating high energetic ions (>keV) in the plasma 160 for the plasma etch process, while reducing a charging effect. The charging effect during a process is a phenomenon where electrons build charge on insulating materials creating a local electric field that may steer positive ions to the sidewalls and cause a lateral etching.

Further illustrated in FIG. 1, the top electrode 150 may be a conductive circular plate inside the plasma processing chamber 110 near the top. In various embodiments, the top electrode 150 may be connected to a to direct current (DC) power source 165 of the plasma processing system 10. Combined with the RF power from the RF power sources 130, the DC power is used to generate a DC superimposed RF plasma in the plasma processing chamber 110. In FIG. 1, the DC power may be supplied to the top electrode 150. In another embodiment, the DC power may be supplied to the bottom electrode 120. The DC voltage $V_{DC}$ supplied by the DC power source 165 can range from positive to negative. In various embodiments, the DC voltage $V_{DC}$ coupled to the top electrode 150 may be in the range of 0 V to about 200 V. In one embodiment, the DC voltage $V_{DC}$ coupled to the top electrode 150 may be about 200 V.

In various embodiments, the plasma processing system 10 may further comprise a focus ring 154 positioned over the bottom electrode 120 to surround the substrate 100. The focus ring 154 may advantageously maintain and extend the uniformity of the plasma 160 to achieve process consistency at the edge of the substrate 100. In various embodiments, the focus ring 154 may have a width of a few cm. In various embodiments, there may be a gap for mechanical clearance between the circumference of the substrate 100 and the focus ring 154. In certain embodiments, the gap may be hundreds of microns to a few mm. In various embodiments, the focus ring 154 may comprise a dielectric material with a desired dielectric constant. In certain embodiments, the focus ring 154 may comprise silicon. Some examples of silicon-based focus ring may comprise silicon, silicon oxide, doped silicon (e.g., boron-doped, nitrogen-doped, and phosphorous-doped), or silicon carbide. Alternatively, in some embodiments, the focus ring may comprise a carbon-based material. In one or more embodiments, the focus ring 154 may comprise a metal oxide, such as aluminum oxide and zirconium oxide.

The configurations of the plasma etching system described above is for example only. In alternative embodiments, various alternative configurations may be used for a plasma processing system. For example, the plasma processing system may be a resonator such as a helical resonator, or an inductively coupled plasma (ICP) processing system. Further, microwave plasma (MW) or other suitable systems may be used. In various embodiments, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of wafers that are spun around a central axis as they pass through different plasma zones. Accordingly, it is possible to have multiple plasma zones, for example, including a metal-containing plasma zone, metal-free plasma zone, and plasma-free zone (e.g., a purge zone).

As illustrated in FIG. 1, the main gas delivery system 115, the RF power sources 130, the DC power source 165, and the set of effusive gas injectors 170 may be all connected to the integrated control circuit 190, and operations of any combination of these systems may be synchronized or asynchronized to enable fine tuning of the plasma conditions, which will be further described below.

Figure 2:
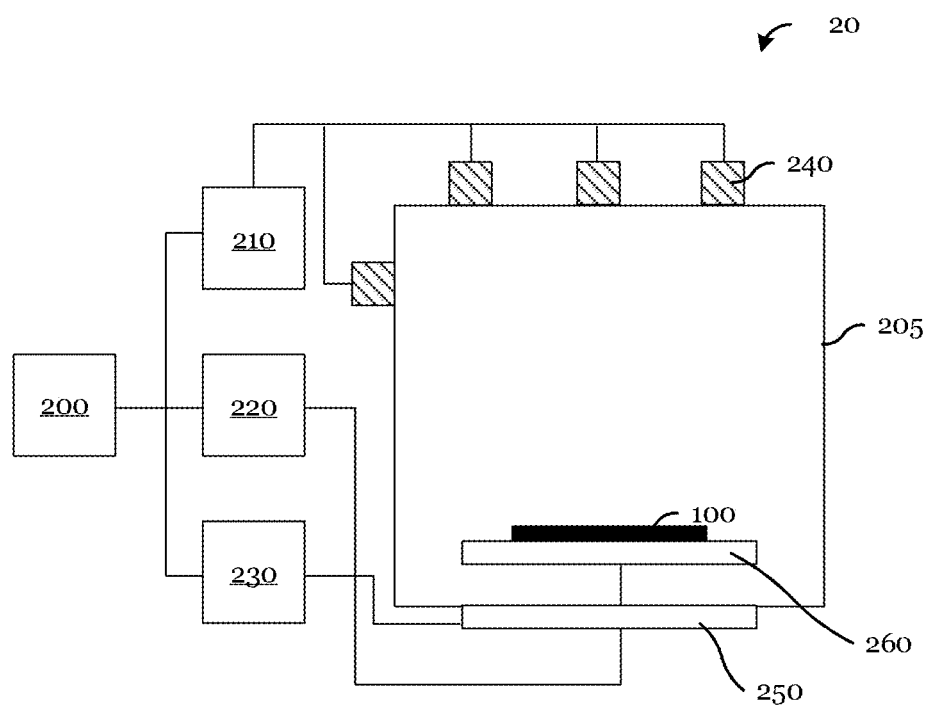
FIG. 2 illustrates a schematic of a controller coupled to a set of effusive gas injectors for a plasma processing system in accordance with various embodiments.

FIG. 2 illustrates a schematic of an integrated control circuit 200 coupled to a set of effusive gas injectors 240 for a plasma processing system 20 in accordance with various embodiments. Many components of the plasma processing system 20 may be identical to those described above referring to FIG. 1, and thus will not be repeated and may be omitted in a simplified illustration of FIG. 2.

In FIG. 2, an example configuration for the integrated control circuit 200 that enables advanced control for additional gas pulsing is illustrated as a part of the plasma processing system 20. The integrated control circuit 200 may be connected to and configured to control a gas delivery system 210, a pressure control system 220, and a RF power source 230. The gas delivery system 210 may further be connected to a set of effusive gas injectors 240, which may be located on the side wall and/or at the top of a plasma processing chamber 205. In certain embodiments, the effusive gas injectors 240 may be configured to enable side gas injection (i.e., injected from the side wall), ring gas injection (i.e., directed to the edge of the substrate 100), and/or center gas injection (i.e., directed to the center of the substrate 100). The pressure control system 220 may further be connected to an automatic pressure controller (APC) 250 disposed at the bottom of the plasma processing chamber 205, and configured to precisely control the chamber pressure. The RF power source 230 may be connected to a bottom electrode 260 and configured to generate and sustain a plasma in the plasma processing chamber 205. In various embodiments, the integrated control circuit 200 may advantageously be used to synchronize or asynchronize RF power pulsing and additional gas pulsing. Exemplary embodiments for synchronizing them will be described referring to FIGS. 11 and 12. With the effusive gas injectors 240, repeatable gas delivery with low latency may be enabled.

Figure 3:
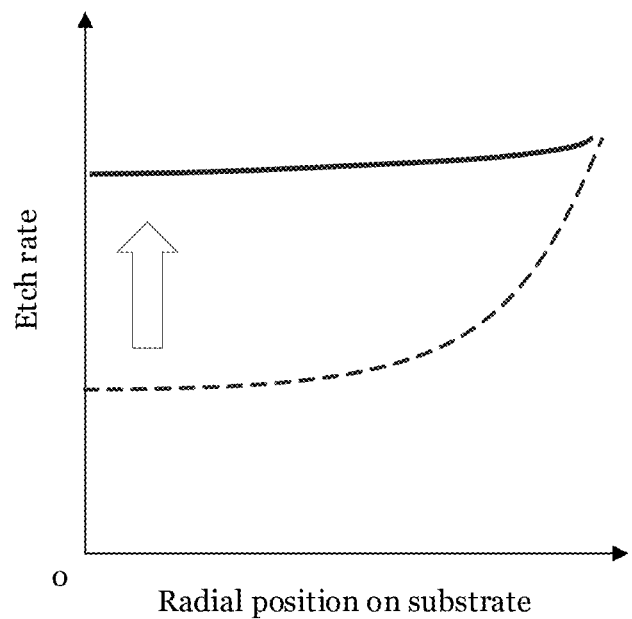
FIG. 3 illustrates an example etch rate as a function of a radial position in a plasma processing chamber in accordance with one embodiment.
Figure 4:
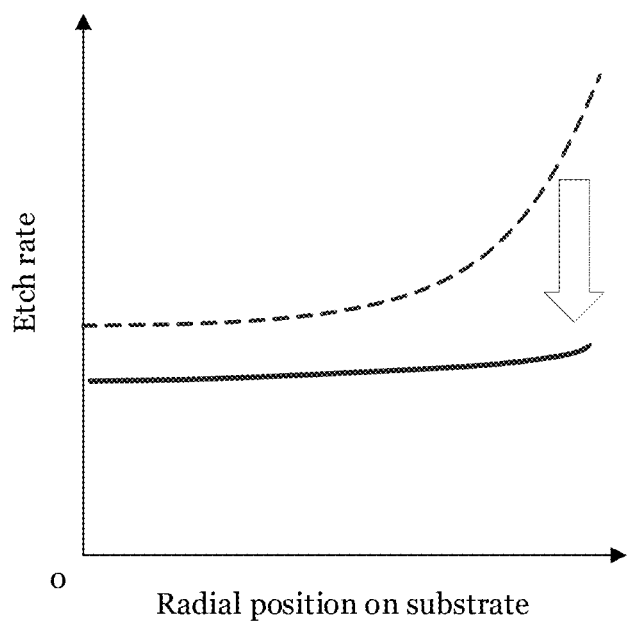
FIG. 4 illustrates an example etch rate as a function of a radial position in a plasma processing chamber in accordance with another embodiment.

FIG. 3 illustrates an example etch rate as a function of a radial position in a plasma processing chamber in accordance with one embodiment. FIG. 4 illustrates an example etch rate as a function of a radial position in a plasma processing chamber in accordance with another embodiment.

In FIGS. 3 and 4, the etch rates across a substrate in a plasma processing chamber with a non-uniform distribution of plasma species are illustrated with dotted lines, and solid lines are used to illustrate ideal uniform etch rate profile across the substrate, which may be enabled by various embodiments of the methods disclosed in this application. In the illustrated example, with a conventional plasma etching condition, the non-uniform distribution of plasma species such as etchants and/or passivating agents across the substrate, the local etch rate at the center of the substrate may tend to be lower than at the edge of the substrate. This difference in etch rate due to the non-uniformity of plasma can cause non-ideal etch profiles, for example, footing at the center (e.g., FIG. 5A) and/or bowing at the edge (e.g., FIG. 8B). In one embodiment, this issue may be addressed by increasing the local etch rate at the center as illustrated in FIG. 3. This may be enabled by pulsing additional etchants near the center, which will be further described in FIGS. 5A-5B, 6A-6B, and 7A-7B. In another embodiment, the non-uniformity may be corrected by decreasing the local etch rate at the edge as illustrated in FIG. 4. This may be enabled by pulsing additional passivants near the edge, which will be further described in FIGS. 8A-8B, 9A-9B, and 10A-10B.

Figures 5A, 5B:
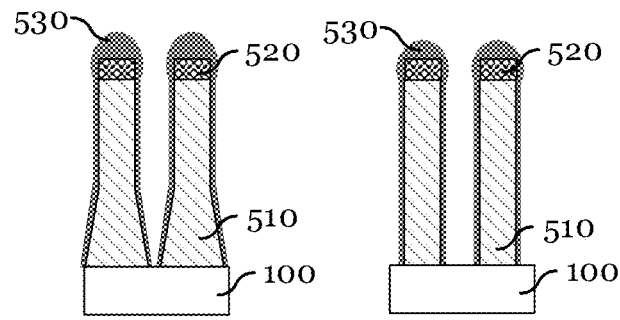

FIGS. 5A and 5B illustrate cross sectional views of an example substrate 100 after a conventional plasma etch process with a non-uniformity issue, wherein FIG. 5A illustrates a profile with footing at the center of the substrate 100, and FIG. 5B illustrates a profile at the edge of the substrate 100.

In FIGS. 5A and 5B, the substrate 100 may comprise an underlying layer 510 and a hard mask layer 520. A deposit 530 may be formed from passivating agents during the plasma etch to passivate the surface. Two distinct regions of the substrate 100, a central region and an edge region, are illustrated in FIGS. 5A and 5B, respectively. Due to the non-uniform distribution of the plasma species such as etchants and passivating agents across the substrate 100, a footing issue may occur at the center of the substrate 100 (FIG. 5A), while the ideal etch profile may be obtained at the edge of the substrate 100 (FIG. 5B).

In various embodiments, the underlying layer 1010 may comprise a polysilicon layer. The polysilicon for the underlying layer 1010 may comprise a doped polysilicon to have desired material properties including electrical properties. The polysilicon layer may be deposited over the substrate 100 using appropriate deposition techniques such as vapor deposition including chemical vapor deposition (CVD), physical vapor deposition (PVD), as well as other plasma processes such as plasma enhanced CVD (PECVD), sputtering, and other processes. In one or more embodiments, the underlying layer 1010 may have a thickness of about 50 nm to about 500 nm.

In various embodiments, the underlying layer 510 may be patterned by the plasma etch process to form a gate structure or a dummy gate structure for a semiconductor device. Accordingly, the underlying layer 510 may be patterned into a fin, a pillar, or any suitable shape. The patterning of the underlying layer 510 may be performed using a plasma dry etch process, for example a reactive ion etching (RIE) process. In one or more embodiments, such a process may be a silicon etch process using a halogen-based chemistry. In one embodiment, an etch gas may comprise a fluorocarbon such as $C_4F_8$. In various embodiments, the hard mask layer 520 may be used as an etch mask during the plasma etch process.

The hard mask layer 520 may comprise silicon oxide in one embodiment. In various embodiments, the hard mask layer 1020 may comprise silicon nitride, silicon carbonitride (SiCN), or silicon oxycarbide (SiOC). In alternate embodiments, the hard mask layer 520 may comprise titanium nitride. In one or more embodiments, the hard mask layer 520 may comprise other suitable organic materials such as spin-on carbon hard mask (SOH) materials. Further, the hard mask layer 520 may be a stacked hard mask comprising, for example, two or more layers using two different materials. In some of such embodiments, the first hard mask of the hard mask layer 520 may comprise a metal-based layer such as titanium nitride, titanium, tantalum nitride, tantalum, tungsten based compounds, ruthenium based compounds, or aluminum based compounds, and the second hard mask material of the hard mask layer 520 may comprise a dielectric layer such as silicon oxide, silicon nitride, SiCN, SiOC, silicon oxynitride, or silicon carbide. The hard mask layer 1020 may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. The hard mask layer 1020 may have a thickness of about 5 nm to about 50 nm in various embodiments. In one or more embodiments, an additional layer such as silicon-containing anti-reflective coating films (SiARC) or other ARC films may be formed over the hard mask layer 520. In further embodiments, a photoresist that may have been used to pattern the hard mask layer 520 by lithography may be left over the hard mask layer 520.

By pulsing an additional gas into the plasma processing chamber during the plasma etch process, this footing issue may be reduced or eliminated.

Figures 6A, 6B:
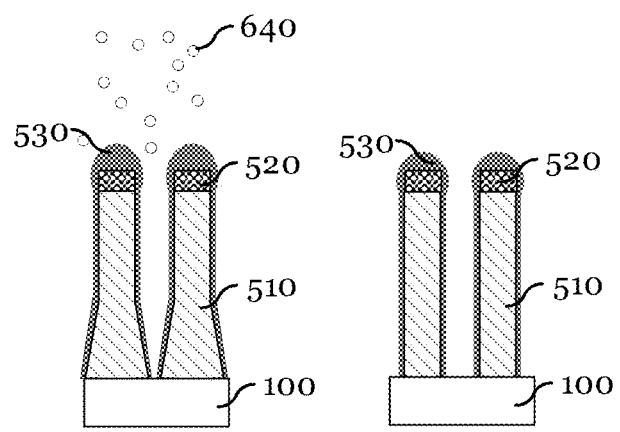

FIGS. 6A and 6B illustrate cross sectional views of an example substrate 100 during a plasma etch process in accordance with various embodiments, wherein FIG. 6A illustrates a profile at the center of the substrate 100 with an additional etchant 640, and FIG. 6B illustrates a profile at the edge of the substrate 100.

Figures 7A, 7B:
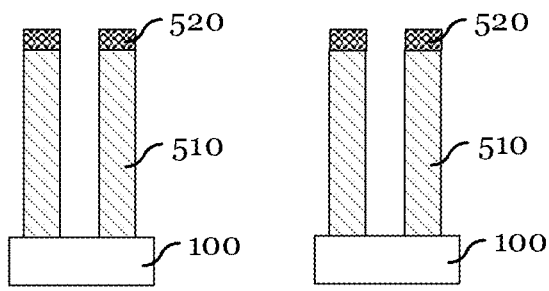

FIGS. 7A and 7B illustrate cross sectional views of an example substrate 100 after the plasma etch process illustrated in FIGS. 6A and 6B in accordance with various embodiments, wherein FIG. 7A illustrates a profile at the center of the substrate 100, and FIG. 7B illustrates a profile at the edge of the substrate 100.

Using the set of effusive gas injectors (e.g., those described in FIG. 1), the additional gas may be pulsed locally to a portion of the substrate 100. In the illustrated example, the additional gas comprise additional etchants, and may be delivered only to the center of the substrate 100, not the edge of the substrate 100. In various embodiments, the process gas and the additional etchants 640 may have the same composition, but in other embodiments they may have different compositions. In certain embodiments, the additional etchants 640 may comprise halogen. In one embodiment, the additional etchants 640 may comprise dichlorine ($Cl_2$). With the additional etchants 640 provided locally to the center of the substrate 100, the local etch rate at the center may be increased (as illustrated in FIG. 3) to be the same or close to the local etch rate at the edge. Consequently, the uniform final features formed by the plasma etch process with additional gas pulsing may be enabled as illustrated in FIGS. 7A and 7B.

Figures 8A, 8B:
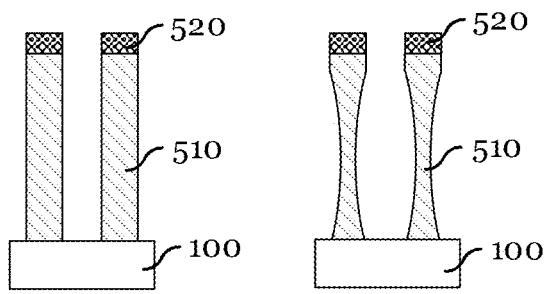

FIGS. 8A and 8B illustrate cross sectional views of an example substrate 100 after a conventional plasma etch process with a non-uniformity issue, wherein FIG. 8A illustrates a profile at the center of the substrate 100, and FIG. 8B illustrates a profile with bowing at the edge of the substrate 100. Similar to the prior embodiments (e.g., FIG. 5A-5B), the substrate 100 may comprise an underlying layer 510 and a hard mask layer 520, which may be identical in terms of their formation and composition and thus will not be repeated.

Two distinct regions of the substrate 100, a central region and an edge region, are illustrated in FIGS. 8A and 8B, respectively. Due to the non-uniform distribution of the plasma species such as etchants and passivating agents across the substrate 100, bowed profiles can be seen at the edge of the substrate 100 (FIG. 8B) while the etch profile at the center is vertical with no bowing (FIG. 8A).

By pulsing an additional gas into the plasma processing chamber during the plasma etch process, this bowing issue may be reduced or eliminated.

Figures 9A, 9B:
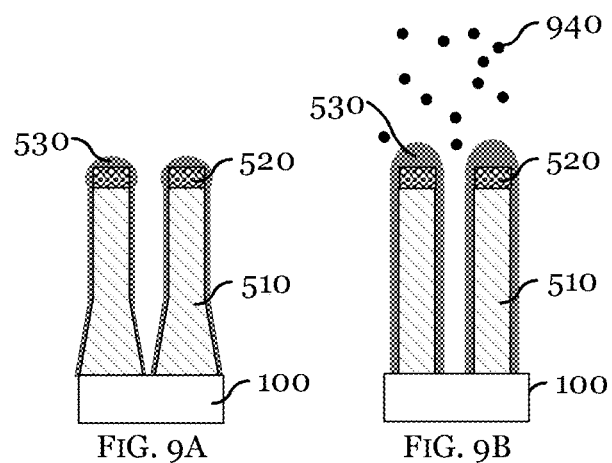

FIGS. 9A and 9B illustrate cross sectional views of an example substrate 100 during a passivation phase of a plasma etch process in accordance with various embodiments, wherein FIG. 9A illustrates a profile at the center of the substrate 100, and FIG. 9B illustrates a profile at the edge of the substrate 100 with additional passivants 940.

Using the set of effusive gas injectors (e.g., those described in FIG. 1), the additional gas may be pulsed locally to a portion of the substrate 100. In the illustrated example, the additional gas comprise additional passivants, and may be delivered only to the edge of the substrate 100, not the center of the substrate 100. Pulsing the additional passivants 940 may lead to an increase in formation of the deposit 530, reinforcing the passivation locally on the edge of the substrate 100. In various embodiments, the process gas and the additional passivants 940 may have the same composition, but in other embodiments they may have different compositions. In certain embodiments, the additional passivants 940 may comprise halogen. In one or more embodiments, the additional passivants 940 may comprise fluorohydrocarbon ($C_xH_yF_z$), silicon bromide ($SiBr_x$), or silicon chloride ($SiCl_x$). In one or more embodiments, the additional passivants 940 may comprise $C_4F_8$, silicon tetrachloride ($SiCl_4$), or a mixture of $SiCl_4$ and dioxygen (02). During this passivation phase, etching of the underlying layer 510 over the substrate 100 may or may not proceed, depending on the plasma conditions. In one embodiment, etching may occur particularly at the center of the substrate 100 while the deposit 530 being formed at the edge with no etching.

Figures 10A, 10B:
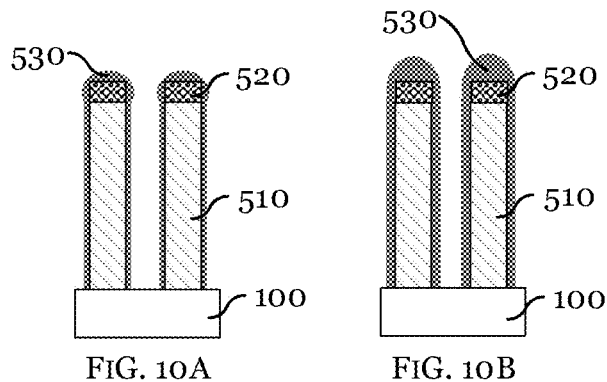

FIGS. 10A and 10B illustrate cross sectional views of an example substrate during an etch phase of a plasma etch process illustrated in FIGS. 9A and 9B in accordance with various embodiments, wherein FIG. 10A illustrates a profile at the center of the substrate 100, and FIG. 10B illustrates a profile at the edge of the substrate 100.

Figures 11A, 11B:
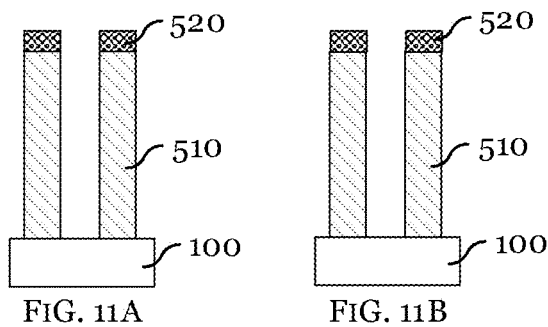

FIGS. 11A and 11B illustrate cross sectional views of an example substrate after the plasma etch process illustrated in FIGS. 9A-9B and 10A-10B in accordance with various embodiments, wherein FIG. 11A illustrates a profile at the center of the substrate 100, and FIG. 11B illustrates a profile at the edge of the substrate 100.

Once the passivation on the edge of the substrate 100 by the passivation phase is complete, an etch phase of the plasma etch process may be performed, where the additional passivants 940 is no longer supplied. During the etch phase, etching occurs across the substrate 100, but with the locally reinforced passivation at the edge. Accordingly, the local etch rate at the edge may be decreased (as illustrated in FIG. 4) to be the same or close to the local etch rate at the center. Consequently, the uniform final features formed by the plasma etch process with additional gas pulsing may be enabled after the plasma etch process as illustrated in FIGS. 11A and 11B.

Two exemplary embodiments for additional gas pulsing have been described above: pulsing additional etchants to the center of a substrate and pulsing additional passivants to the edge of a substrate. Nevertheless, it should be noted that the methods of additional gas pulsing is not limited to these particular combinations. The target location for additional gas pulsing and gas compositions may be selected in consideration of the nature of the non-uniformity of a plasma during a plasma processing. In one embodiment, additional passivants may be delivered to the edge or additional etchants may be delivered to the center. Further, the methods of additional gas pulsing is not limited to pulsing only to the center or the edge of the substrate. The position of the gas inlet nozzle of an effusive gas injector and the direction of gas injection (i.e., an angle that the nozzle makes to substrate normal) can determine the directionality and localization of etching/passivating fluxes at any reasonable positions on the substrate.

In various embodiments, the additional gas pulsing may be enabled using more than one effusive gas injectors. For example, pulsing additional passivants to the edge of a substrate may typically require multiple effusive gas injectors, which are arranged concentrically surrounding the substrate to enable a ring-shaped gas stream. In other embodiments, multiple effusive gas injectors may be used to deliver different gas components to different regions of the substrate. In one embodiment, a first effusive gas injector may be used to deliver additional etchants to the center of the substrate and a second effusive gas injector to deliver additional passivants to the edge of the substrate. Further, operations of such two effusive gas injectors may be synchronized or asynchronized. In other words, more than one additional gas pulsing may be integrated into a plasma etch process recipe to achieve local modulation of the plasma conditions.

Figure 12:
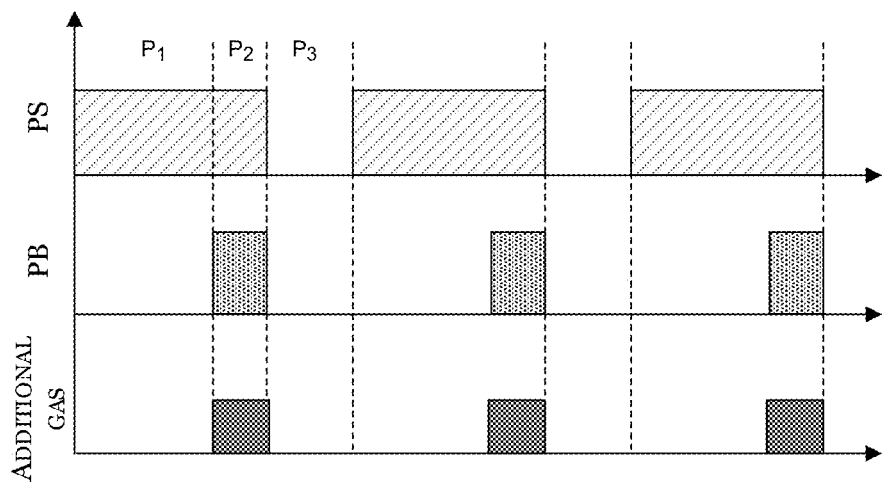
FIG. 12 illustrates a time diagram for pulsed source power (PS), pulsed bias power (PB), and pulsed additional gas injection in accordance with one embodiment.

FIG. 12 illustrates a time diagram for pulsed source power (PS), pulsed bias power (PB), and pulsed additional gas injection in accordance with one embodiment.

The additional gas pulsing may be based on any reasonable gas pulse trains. In various embodiments, a duration of each gas pulsing may be shorter than a residence time of the gas in the plasmas processing chamber to prevent a steady flow from being established. Such fast pulsing may advantageously benefit localizing the additional gas around the point of first impact on the substrate.

In various embodiments, the additional gas pulsing can be synchronized to the etching phase of the RF pulse (i.e., RF bias-ON period), ensuring, for example, the additional etchant flux is available at the substrate center only during the etching phase. This would ensure that etch performance in other parts of the substrate would remain unchanged. Such an embodiment may particularly be beneficial to overcome the footing issue described above referring to FIGS. 3, 5A-5B, 6A-6B, and 7A-7B.

In FIG. 12, the identical pulse train may be used for the RF bias power (PB) and the additional gas pulsing so that they are both ON during phase 2 (P2) and OFF during phase 1 (P1) and phase 3 (P3). On the other hand, the RF source power (PS) may have a different pulsing pattern: for example, ON during P1 and P2 and OFF during P3.

Figure 13:
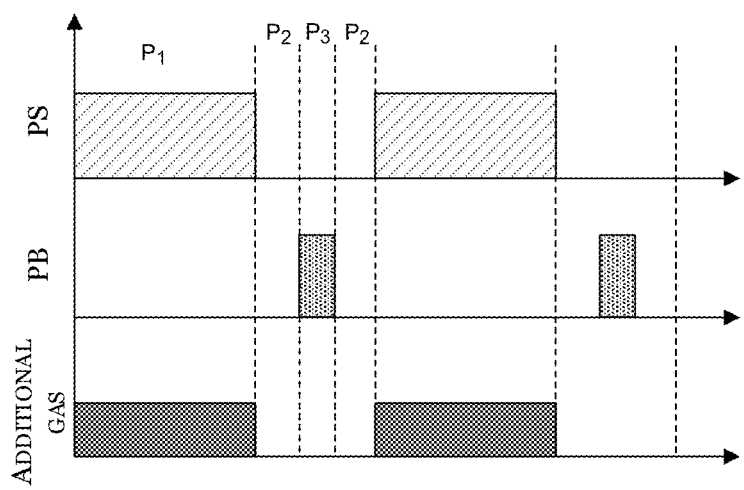
FIG. 13 illustrates a time diagram for pulsed source power (PS), pulsed bias power (PB), and pulsed additional gas injection in accordance with another embodiment.
Figure 14:
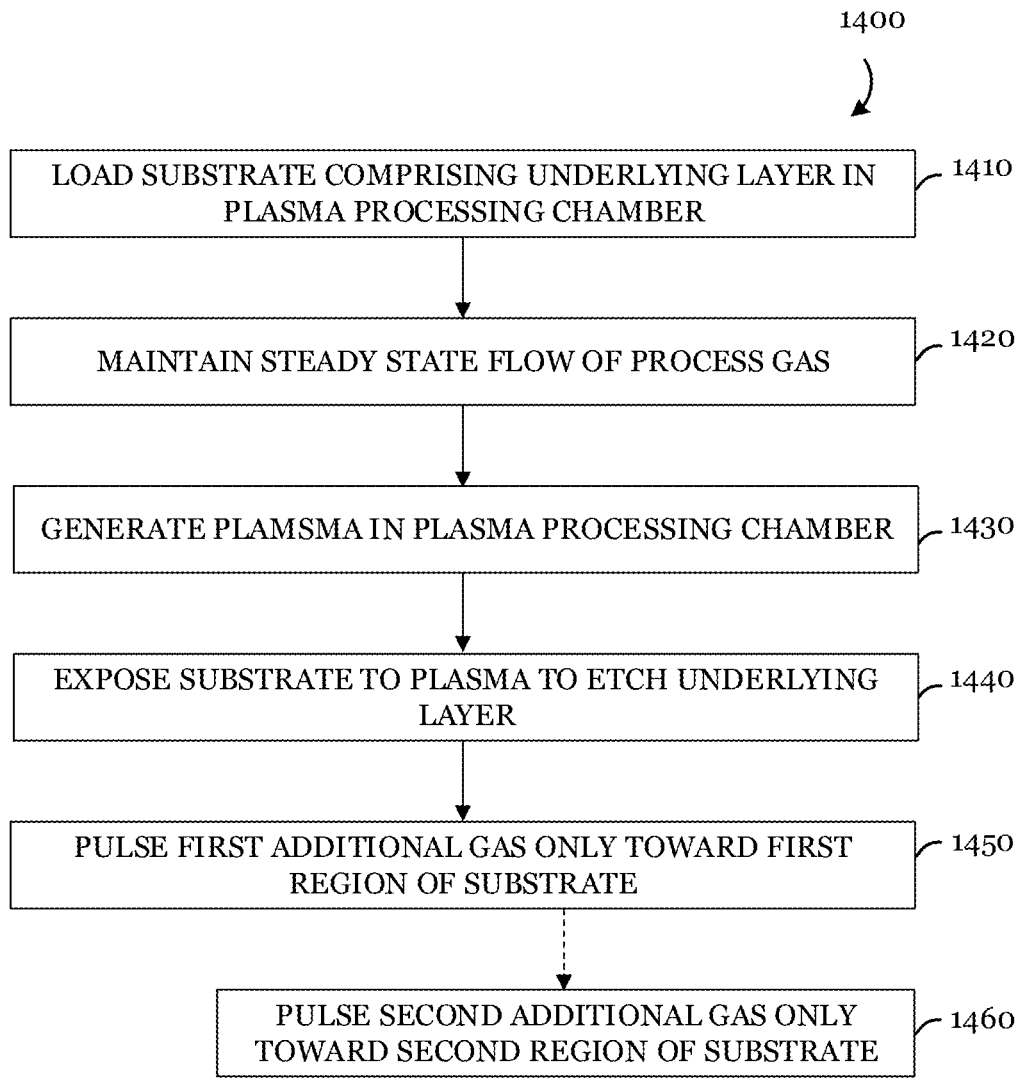
FIG. 14 illustrates an example process flow diagram in accordance with various embodiments.

FIG. 13 illustrates another time diagram for pulsed source power (PS), pulsed bias power (PB), and pulsed additional gas injection in accordance with another embodiment.

In FIG. 13, the additional gas pulsing is synchronized to source power (PS) and asynchronized to the etching phase of the RF pulse (i.e., RF bias-ON period). For example, passivating gases as the additional gas may be introduced to the edge of the substrate during the passivation phase of the RF pulse (i.e., when bias power is OFF or low power). This can improve passivation locally, potentially lowering etching rate at the edge of the substrate. Such an embodiment may particularly be beneficial to overcome the bowing issue described above referring to FIGS. 4, 8A-8B, 9A-9B, 10A-10B, and 11A-11B.

In FIG. 13, the identical pulse train may be used for the RF source power (PS) and the additional gas pulsing so that they are both ON during phase 1 (P1) and OFF during phase 2 (P2) and phase 3 (P3). On the other hand, the RF bias power (PS) may have a different pulsing pattern: for example, ON during P3 and OFF during P1 and P2.

Embodiments illustrated in FIGS. 12 and 13 are for example only, and various other pulsing schemes are possible for any combination of source power, bias power, and additional gas injection. For example, in certain embodiments, gas pulsing and power (source or bias) may be synched with a delay. In one embodiment, the additional gas pulsing may occur first followed by the pulsing of source power or bias power. Such a delay of one of the synched pulse trains may be a few milliseconds in one embodiment, but may be longer or shorter in other embodiments.

Further, although FIGS. 12 and 13 illustrate pulse trains with square waves, in other embodiments, any suitable wave form (e.g., triangle waves, sinusoidal waves, trapezoidal waves, etc.) may be used to provide source power, bias power, and additional gas injection.

FIG. 14 illustrates an example process flow diagram in accordance with various embodiments.

In FIG. 14, a process flow 1400 starts with loading a substrate comprising an underlying layer such as a silicon layer in a plasma processing chamber (block 1410). Next, a steady state flow of a process gas into the plasma processing chamber may be established and maintained (block 1420). While flowing the process gas, a plasma may be generated in the plasma processing chamber (block 1430). Subsequently, the substrate may be exposed to the plasma to etch the underlying layer (block 1440), and a first additional gas may be pulsed using a first effusive gas injector towards a first region of the substrate to disrupt the steady flow state flow of the process gas over the first region (block 1450). In certain embodiments, the process flow 1400 may further proceed to pulse a second additional gas using a second effusive gas injector towards a second region of the substrate to disrupt the steady flow state flow of the process gas over the second region (block 1460).

Example embodiments are summarized here. Other embodiments can also be understood from the entirety of the specification as well as the claims filed herein.

Example 1. A method of processing a substrate that includes: loading the substrate in a plasma processing chamber, the substrate including an underlying layer; maintaining a steady state flow of a process gas into the plasma processing chamber in the plasma processing chamber; generating a plasma in the plasma processing chamber; exposing the substrate to the plasma to etch the underlying layer; and pulsing a first additional gas, using a first effusive gas injector, towards a first region of the substrate to disrupt the steady state flow of the process gas over the first region, the pulsing locally changing a composition of the plasma near the first region.

Example 2. The method of example 1, where the first additional gas is pulsed only towards the first region and not towards a second region of the substrate, the first region being an edge portion of the substrate and the second region being a central portion of the substrate.

Example 3. The method of one of examples 1 or 2, where the first additional gas includes a passivant, and where a local etch rate near the edge portion of the substrate is reduced due to the passivant.

Example 4. The method of one of examples 1 to 3, where the first additional gas includes C4F8 or SiCl4.

Example 5. The method of one of examples 1 to 4, where the first region includes a central portion of the substrate.

Example 6. The method of one of examples 1 to 5, where the first additional gas includes an etchant, and where a local etch rate near the central portion of the substrate is increased due to the etchant.

Example 7. The method of one of examples 1 to 6, where the first additional gas includes Cl2, CF4, or HBr.

Example 8. The method of one of examples 1 to 7, where the generating the plasma including providing a RF power pulse train to an electrode of the plasma processing chamber, and where the method further including synchronizing the pulsing the first additional gas with the RF power pulse train.

Example 9. The method of one of examples 1 to 8, where the generating the plasma including providing a RF power pulse train to an electrode of the plasma processing chamber, and where the method further including asynchronizing the pulsing the first additional gas with the RF power pulse train.

Example 10. The method of one of examples 1 to 9, further including, while flowing the process gas, pulsing a second additional gas, using a second effusive gas injector, toward only a second region of the substrate, the pulsing the second additional gas locally changing a composition of the plasma near the second region, the second region being different from the first region.

Example 11. The method of one of examples 1 to 10, where the pulsing of the first additional gas is shorter than a residence time of the process gas in the plasma processing chamber.

Example 12. A method of processing a substrate that includes: loading the substrate in a plasma processing chamber, the substrate including an underlying layer; maintaining a steady state flow of a process gas into the plasma processing chamber in the plasma processing chamber; providing a pulsed RF source power to a first electrode of the plasma processing chamber to generate a plasma in the plasma processing chamber; providing a pulsed RF bias power to a second electrode of the plasma processing chamber to bias the plasma; exposing the substrate to the plasma to etch the underlying layer; and pulsing an additional gas, using an effusive gas injector, towards a region of the substrate to disrupt the steady state flow of the process gas over the region, the pulsing locally changing a composition of the plasma near the first region.

Example 13. The method of example 12, where a flow of the additional gas is ON while the RF source power is ON.

Example 14. The method of one of examples 12 or 13, where a flow of the additional gas is ON while the RF bias power is ON.

Example 15. A plasma etching system for a substrate including: a plasma processing chamber; a substrate holder disposed in the plasma processing chamber; a first RF power source configured to generate a plasma in the plasma processing chamber; a second RF power source configured to bias the plasma; a main gas inlet system configured to flow a process gas into the plasma processing chamber; effusive gas injectors configured to inject an additional gas into the plasma processing chamber; and a controller coupled to the first RF power source, the second RF power source, the main gas inlet system, and the effusive gas injectors.

Example 16. The plasma etching system of example 15, where the effusive gas injectors are disposed above the substrate holder and near a central portion of the substrate holder.

Example 17. The plasma etching system of one of examples 15 or 16, further including a plurality of effusive gas injectors, the plurality of effusive gas injectors are disposed near a top plate of the plasma processing chamber and in a circular pattern surrounding an edge of the substrate holder.

Example 18. The plasma etching system of one of examples 15 to 17, further including a plurality of effusive gas injectors, the plurality of effusive gas injectors are disposed near a sidewall of the plasma processing chamber and in a circular pattern surrounding an edge of the substrate holder.

Example 19. The plasma etching system of one of examples 15 to 18, where the controller is configured to synchronize injecting the additional gas into the plasma processing chamber with operations of the first RF power source, the second RF power source, or the main gas inlet system.

Example 20. The plasma etching system of one of examples 15 to 19, where the controller is configured to asynchronize injecting the additional gas into the plasma processing chamber with operations of the first RF power source, the second RF power source, or the main gas inlet system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   loading the substrate in a plasma processing chamber, the substrate comprising an underlying layer;
   maintaining a steady state flow of a process gas into the plasma processing chamber in the plasma processing chamber;
   generating a plasma in the plasma processing chamber;
   exposing the substrate to the plasma to etch the underlying layer; and
   pulsing a first additional gas, using a first effusive gas injector, towards a first region of the substrate to disrupt the steady state flow of the process gas over the first region, the pulsing locally changing a composition of the plasma near the first region.

2. The method of claim 1, wherein the first additional gas is pulsed only towards the first region and not towards a second region of the substrate, the first region being an edge portion of the substrate and the second region being a central portion of the substrate.

3. The method of claim 2, wherein the first additional gas comprises a passivant, and wherein a local etch rate near the edge portion of the substrate is reduced due to the passivant.

4. The method of claim 3, wherein the first additional gas comprises C4F8 or SiCl4.

5. A method of processing a substrate, the method comprising:
   loading the substrate in a plasma processing chamber, the substrate comprising an underlying layer;
   maintaining a steady state flow of a process gas into the plasma processing chamber in the plasma processing chamber;
   generating a plasma in the plasma processing chamber;
   exposing the substrate to the plasma to etch the underlying layer; and
   pulsing a first additional gas, using a first effusive gas injector, towards a first region of the substrate to disrupt the steady state flow of the process gas over the first region, the pulsing locally changing a composition of the plasma near the first region, wherein the first region comprises a central portion of the substrate.

6. The method of claim 5, wherein the first additional gas comprises an etchant, and wherein a local etch rate near the central portion of the substrate is increased due to the etchant.

7. The method of claim 6, wherein the first additional gas comprises Cl2, CF4, or HBr.

8. The method of claim 1, wherein the generating the plasma comprising providing a RF power pulse train to an electrode of the plasma processing chamber, and wherein the method further comprising synchronizing the pulsing of the first additional gas with the RF power pulse train.

9. The method of claim 1, wherein the generating the plasma comprising providing a RF power pulse train to an electrode of the plasma processing chamber, and wherein the method further comprising asynchronizing the pulsing of the first additional gas with the RF power pulse train.

10. The method of claim 1, further comprising, while flowing the process gas, pulsing a second additional gas, using a second effusive gas injector, toward only a second region of the substrate, the pulsing of the second additional gas locally changing a composition of the plasma near the second region, the second region being different from the first region.

11. The method of claim 1, wherein the pulsing of the first additional gas is shorter than a residence time of the process gas in the plasma processing chamber.

12. A method of processing a substrate, the method comprising:

loading the substrate in a plasma processing chamber, the substrate comprising an underlying layer;

maintaining a steady state flow of a process gas into the plasma processing chamber in the plasma processing chamber;

providing a pulsed RF source power to a first electrode of the plasma processing chamber to generate a plasma in the plasma processing chamber;

providing a pulsed RF bias power to a second electrode of the plasma processing chamber to bias the plasma;

exposing the substrate to the plasma to etch the underlying layer; and pulsing an additional gas, using an effusive gas injector, towards a region of the substrate to disrupt the steady state flow of the process gas over the region, the pulsing locally changing a composition of the plasma near a first region.

13. The method of claim 12, wherein a flow of the additional gas is ON while the RF source power is ON.

14. The method of claim 12, wherein a flow of the additional gas is ON while the RF bias power is ON.

* * * * *